US012396218B2

(12) United States Patent
Ko

(10) Patent No.: US 12,396,218 B2
(45) Date of Patent: Aug. 19, 2025

(54) THIN FILM TRANSISTOR, FABRICATION METHOD THEREOF, AND DISPLAY APPARATUS COMPRISING THE SAME

(71) Applicant: LG Display Co., Ltd., Seoul (KR)

(72) Inventor: Seunghyo Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 481 days.

(21) Appl. No.: 17/896,981

(22) Filed: Aug. 26, 2022

(65) Prior Publication Data

US 2023/0071215 A1 Mar. 9, 2023

(30) Foreign Application Priority Data

Sep. 3, 2021 (KR) ........................ 10-2021-0117836
Dec. 31, 2021 (KR) ........................ 10-2021-0194778

(51) Int. Cl.
*H10D 30/67* (2025.01)
*H10D 86/40* (2025.01)
*H10D 86/60* (2025.01)
*H10D 99/00* (2025.01)

(52) U.S. Cl.
CPC ..... *H10D 30/6757* (2025.01); *H10D 30/6755* (2025.01); *H10D 86/423* (2025.01); *H10D 86/60* (2025.01); *H10D 99/00* (2025.01)

(58) Field of Classification Search
CPC ........... H10D 30/6723; H10D 30/6755; H10D 30/6757; H10D 86/423; H10D 86/60; H10D 99/00
See application file for complete search history.

(56) References Cited

U.S. PATENT DOCUMENTS

2014/0042437 A1* 2/2014 Yamazaki .............. H10D 62/80 257/43
2016/0300950 A1* 10/2016 Lee ...................... H10D 30/673

* cited by examiner

*Primary Examiner* — Matthew C Landau
*Assistant Examiner* — Dmitriy Yemelyanov
(74) *Attorney, Agent, or Firm* — Fenwick & West LLP

(57) ABSTRACT

Disclosed is a thin film transistor, a fabrication method thereof, and a display apparatus comprising the same, wherein the thin film transistor comprises a light shielding layer, an active layer on the light shielding layer, a gate electrode spaced apart from the active layer and overlapped with at least a portion of the active layer, and an inorganic insulating layer between the active layer and the light shielding layer, wherein the active layer includes a carrier acceptor.

13 Claims, 12 Drawing Sheets

THIN FILM TRANSISTOR, FABRICATION METHOD THEREOF, AND DISPLAY APPARATUS COMPRISING THE SAME

CROSS-REFERENCE TO RELATED APPLICATIONS

This application claims the benefit of Korean Patent Application No. 10-2021-0117836 filed on Sep. 3, 2021, and Korean Patent Application No. 10-2021-0194778 filed on Dec. 31, 2021, all of which are hereby incorporated by reference as if fully set forth herein.

BACKGROUND

Technical Field

The present disclosure relates to a thin film transistor, a fabrication method thereof, and a display apparatus comprising the same.

Description of the Related Art

According to a material constituting an active layer, a thin film transistor may be divided into an amorphous silicon thin film transistor using an active layer of amorphous silicon, a polycrystalline silicon thin film transistor using as an active layer of polycrystalline silicon, and an oxide semiconductor thin film transistor using as an active layer of oxide semiconductor.

As the oxide semiconductor thin film transistor TFT has a large resistance change according to the content of oxygen, it facilitates obtaining the desired physical properties. Also, since the oxide constituting the active layer becomes a thin film at a relatively low temperature for a fabrication process of the oxide semiconductor thin film transistor, a manufacturing cost is low. The oxide semiconductor is transparent owing to the properties of the oxide, whereby it is favorable to a realization of a transparent display apparatus.

Preferably, a driving thin film transistor used as a driving device of a display apparatus has a large S-factor for a grayscale representation. Therefore, it necessarily requires a study for securing a large S-factor in a thin film transistor used as a driving device of a display apparatus. In addition, a thin film transistor with a double gate structure facilitates high driving current and integration of the thin film transistor, however, it is disadvantageous in that it is weak in terms of reliability of positive bias temperature stress PBTS. Accordingly, it is necessary to study a method for improving reliability of positive bias temperature stress PBTS in a thin film transistor.

SUMMARY

The inventors of the present disclosure recognize the above-mentioned problems and made various experiments to increase a S-factor of a driving thin film transistor and to improve PBTS reliability. On the basis of results of the various experiments, it has proposed a thin film transistor with the increased S-factor and improved PBTS reliability, a display apparatus comprising the same, and a fabrication method of the thin film transistor.

The present disclosure has been made in view of the above problems, and it is an object of the present disclosure to provide a thin film transistor with large S-factor and improved PBTS reliability.

It is another object of the present disclosure to provide a method of improving PBTS reliability of a thin film transistor by forming a defect state in an active layer or an interface between an active layer and an inorganic insulating layer. Also, it is another object of the present disclosure to provide a thin film transistor with the improved PBTS reliability by forming the defect state in the active layer or the interface between the active layer and the inorganic insulating layer.

It is another object of the present disclosure to provide a method of increasing S-factor of a thin film transistor by forming a defect state in an active layer. Also, it is another object of the present disclosure to provide a thin film transistor with the large S-factor by forming the defect state in the active layer.

It is another object of the present disclosure to provide a method of forming a defect state in a surface of a first active layer by copper Cu ions.

It is another object of the present disclosure to provide a thin film transistor with the first active layer having copper Cu ions.

It is another object of the present disclosure to provide a display apparatus with great grayscale representation by the use of driving thin film transistor having the large S-factor.

In accordance with an aspect of the present disclosure, the above and other objects can be accomplished by the provision of a thin film transistor comprising a light shielding layer, an active layer on the light shielding layer, a gate electrode spaced apart from the active layer and overlapped with at least a portion of the active layer, and an inorganic insulating layer between the active layer and the light shielding layer, wherein the active layer includes a carrier acceptor, for example, copper.

In accordance with another aspect of the present disclosure, the above and other objects can be accomplished by the provision of a display apparatus comprising the thin film transistor described above.

In still another embodiment, a thin film transistor comprises: an insulating layer on a substrate; and an oxide semiconductor layer on the insulating layer, wherein the oxide semiconductor layer includes: a channel portion; a first connection portion which contacts a first side of the channel portion; a second connection portion which contacts a second side of the channel portion opposite the first side of the channel portion; and a carrier acceptor layer including copper material. In some embodiments, the copper material may include $Cu^{+}$ and $Cu^{2+}$. In some embodiments, the copper material may include copper oxide (CuO).

In accordance with another aspect of the present disclosure, the above and other objects can be accomplished by the provision of a fabrication method of a thin film transistor comprising forming a first gate electrode on a substrate, forming a buffer layer on the first gate electrode, forming a first active material layer on the buffer layer, forming a copper material layer on the first active material layer, removing the copper material layer, applying a heat treatment to the first active material layer, and forming a second active material layer on the first active material layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Figure 1:
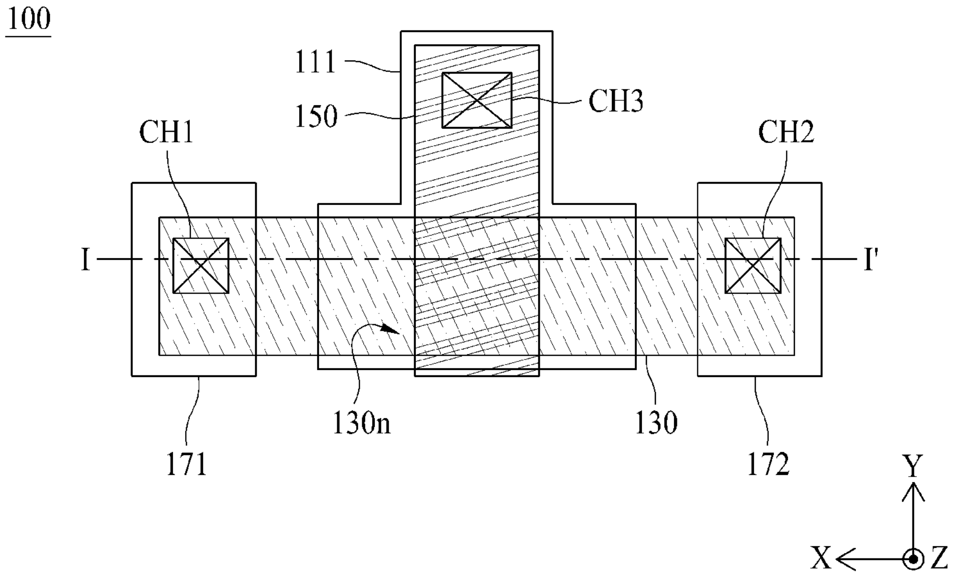
FIG. 1 is a plan view of a thin film transistor according to the embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

Figure 2:
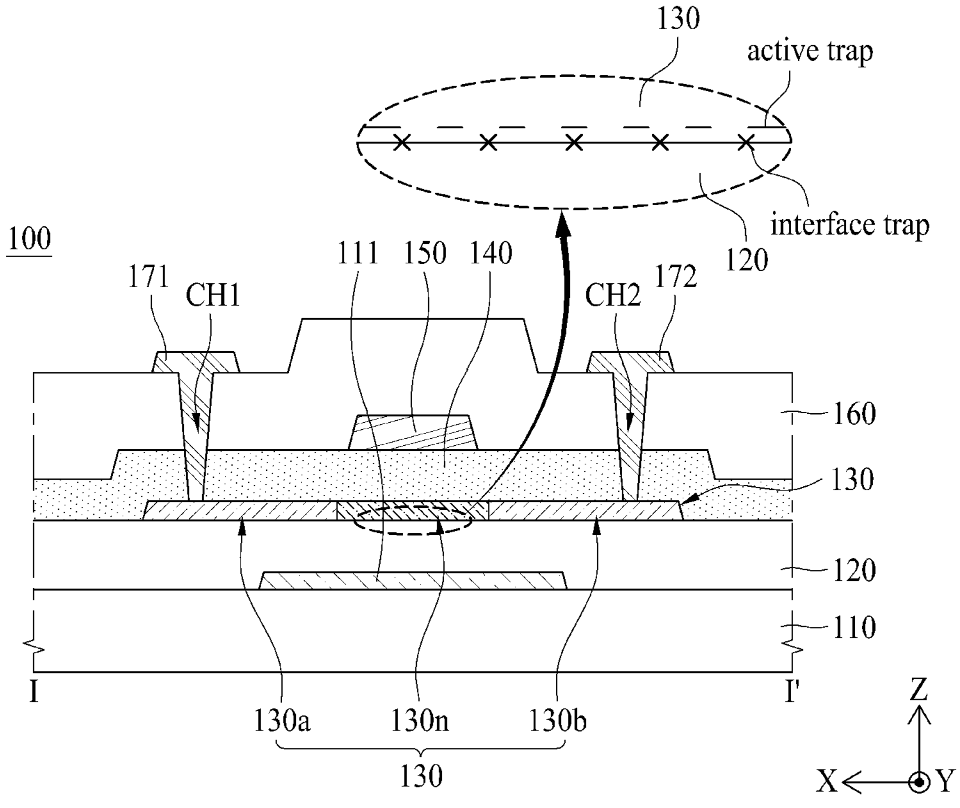
FIG. 2 is a cross sectional view of one embodiment along I-I' of FIG. 1.

FIG. 1 is a plan view of a thin film transistor according to the embodiment of the present disclosure, and FIG. 2 is a cross sectional view along line I-I' of FIG. 1.

Referring to FIGS. 1 and 2, a thin film transistor 100 according to the embodiment of the present disclosure may include a light shielding layer 111 on a substrate 110, a buffer layer 120 on the light shielding layer 111, an active layer 130 on the buffer layer 120, a gate insulating film 140 on the active layer 130, a gate electrode 150 on the gate insulating film 140, and an interlayer insulating film 160 for covering the active layer 130 and the gate electrode 150.

The substrate 110 may be a glass substrate, a curable or bendable thin film glass substrate, a plastic substrate, or a silicon wafer substrate. If using plastic for the substrate 110, transparent plastic having flexibility, for example, polyimide may be used. If the substrate 110 is formed of polyimide, heat resistant polyimide capable of enduring a high temperature may be used in consideration of a high temperature deposition process on the substrate 110.

The light shielding layer 111 may be disposed on the substrate 110. The light shielding layer 111 overlaps a channel portion 130*n* of the active layer 130.

According to the embodiment of the present disclosure, the light shielding layer 111 may include at least one of aluminum-based metal materials such as aluminum Al or aluminum alloys, silver-based metal materials such as silver Ag or silver alloys, copper-based metal materials such as copper Cu or copper alloys, molybdenum-based metal materials such as molybdenum Mo or molybdenum alloys, chromium Cr, tantalum Ta, neodymium Nd, and titanium Ti. The gate electrode 150 may have a multi-layered structure including at least two conductive layers having different physical properties.

According to one embodiment of the present disclosure, the light shielding layer 111 may be connected to the gate electrode 150. As the light shielding layer 111 is connected to the gate electrode 150, a gate voltage may be applied to the light shielding layer 111. As a result, the thin film transistor 100 according to one embodiment of the present disclosure may exhibit the same effect as a double gate structure.

The buffer layer 120 may be disposed on the light shielding layer 111 and the substrate 110.

According to the embodiment of the present disclosure, the buffer layer 120 may be formed in a multi-layered structure by depositing at least one of a silicon oxide film SiOx, silicon nitride film SiN, and a silicon oxynitride film SiON. The buffer layer 120 protects the light shielding layer 111. Accordingly, other components of the thin film transistor 100 including the active layer 130, which will be described later, may be disposed on the buffer layer 120.

The active layer 130 is disposed on the buffer layer 120.

The active layer 130 may be disposed while being overlapped with the light shielding layer 111, the gate electrode 150, and first and second electrodes 171 and 172. The active layer 130 may include the channel portion 130*n*, a first connection portion 130*a*, and a second connection portion 130*b*. The first connection portion 130*a* contacts one side of the channel portion 130*n*, and the second connection portion 130*b* contacts the other side of the channel portion 130*n*.

The first connection portion 130*a* and the second connection portion 130*b* may be formed by selective conduction of the active layer 130. For example, the first connection portion 130*a* and the second connection portion 130*b* may be formed by ion doping using metal ions.

The first connection portion 130*a* and the second connection portion 130*b* are also referred to as conductor portions. According to the embodiment of the present disclosure, the first connection portion 130*a* of the active layer 130 becomes a source region, and the second connection portion 130*b* becomes a drain region. However, the embodiment of the present disclosure is not limited thereto. For example, the first connection portion 130*a* may be a drain region, and the second connection portion 130*b* may be a source region.

According to the embodiment of the present disclosure, the active layer 130 may have a multi-layered structure.

According to one embodiment of the present disclosure, the active layer 130 may include an oxide semiconductor material.

For example, the active layer 130 may be formed of IGZO (InGaZnO)-based oxide semiconductor material, IGO(InGaO)-based oxide semiconductor material, IGZTO(InGaZnSnO)-based oxide semiconductor material, GZTO (GaZnSnO)-based oxide semiconductor material, GZO (GaZnO)-based oxide semiconductor material, GO(GaO)-based oxide semiconductor material, IZO(InZnO)-based oxide semiconductor material, TO(SnO)-based oxide semiconductor material, IO(InO)-based oxide semiconductor material IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO (GaZnSnO)-based oxide semiconductor material, ITZO (InSnZnO)-based oxide semiconductor material, and FIZO (FeInZnO)-based oxide semiconductor material. However, one embodiment of the present disclosure is not limited thereto, and the active layer 130 may be formed by other oxide semiconductor materials known to those in the art.

According to one embodiment of the present disclosure, the active layer 130 includes a carrier acceptor. According to one embodiment of the present disclosure, the carrier acceptor may comprise copper Cu.

According to one embodiment of the present disclosure, copper Cu may be in an ion state. For example, in the active layer 130, copper Cu may be in a state of Cu2O or CuO. When copper Cu is in a state of Cu2O, copper Cu may be referred to as a monovalent ion Cu+ state. When copper Cu is in a state of CuO, copper Cu may be referred to as a divalent ion $Cu^{2+}$ state.

According to one embodiment of the present disclosure, "copper Cu" means that it includes both copper atoms and copper ions Cu+ and $Cu^{2+}$.

According to one embodiment of the present disclosure, copper Cu contained in the active layer 130 may be mainly in a divalent ion $Cu^{2+}$ state. Specifically, copper Cu of the active layer 130 includes Cu+ and $Cu^{2+}$. According to one embodiment of the present disclosure, the concentration of $Cu^{2+}$ in the active layer 130 may be higher than the concentration of Cu+ in the active layer 130.

Referring to a fabrication method described below, after forming a copper material layer on the active layer 130, the copper material layer is removed so that the copper ion Cu+ or $Cu^{2+}$ remains in the active layer 130. After that, a heat treatment is applied thereto, whereby the copper ions may be mainly in the divalent ion $Cu^{2+}$ state. According to one embodiment of the present disclosure, copper Cu of the divalent ion $Cu^{2+}$ state is combined with oxygen, whereby it may be in copper oxide of CuO state.

The copper Cu combined with oxygen may exhibit an effect such as formation of an artificial defect in the active layer 130. The copper Cu inducing this defect forms an acceptor like trap so that it is possible to increase S-factor of the thin film transistor 100, and to reduce a positive bias temperature stress PBTS. Referring to FIG. 2, since the copper included in the active layer 130 may be recognized as a kind of defect in the active layer 130, it may be shown as an active trap, and it may be positioned in the active layer 130, as shown in FIG. 2.

According to one embodiment of the present disclosure, the interface or boundary line between the active layer 130 and the buffer layer 120 may include copper. Herein, "copper Cu" may be in the same form as the copper Cu of the active layer 130. Therefore, according as the copper Cu in the interface or boundary line between the active layer 130 and the buffer layer 120 may be in the copper oxide of CuO state in the same manner as the copper of the active layer 130, the acceptor like trap may be formed so that it is possible to increase the S-factor of the thin film transistor 100, and to reduce the PBTS.

Referring to FIG. 2, the copper included in the interface between the active layer 130 and the buffer layer 120 may be shown as an interface trap, and may be positioned in the active layer 130 and the buffer layer 120, as shown in FIG. 2.

Meanwhile, FIG. 2 shows a top gate structure in which the gate electrode 150 is provided above the active layer 130. The present disclosure may include a bottom gate structure in which the gate electrode 150 is provided below the active layer 130 and the gate insulating film 140 is provided between the gate electrode 150 and the active layer 130. In case of the bottom gate structure, the interface trap is included in the interface between the active layer 130 and the gate insulating film 140, which may be identically applied to those of the following embodiments of the present disclosure.

The gate insulating film 140 is disposed on the active layer 130 and the buffer layer 120, is disposed between the gate electrode 150 and the active layer 130 and is configured to protect the active layer 130. The gate insulating film 140 may include a silicon nitride film SiNx or a silicon oxide film SiOx, but not limited thereto. The gate insulating film 140 may have a single-layered structure or a multi-layered structure.

The gate electrode 150 is disposed on the gate insulating film 140. The gate electrode 150 overlaps the channel portion 130n of the active layer 130.

The gate electrode 150 may include at least one of aluminum-based metal materials such as aluminum Al or aluminum alloys, silver-based metal materials such as silver Ag or silver alloys, copper-based metal materials such as copper Cu or copper alloys, molybdenum-based metal materials such as molybdenum Mo or molybdenum alloys, chromium Cr, tantalum Ta, neodymium Nd, and titanium Ti. The gate electrode 150 may have a multi-layered structure including at least two conductive layers having the different physical properties.

The gate electrode 150 may be connected to the light shielding layer 111 through a third contact hole CH3. According as the gate electrode 150 is connected to the light shielding layer 111, a gate voltage may be applied to the light shielding layer 111. As a result, the thin film transistor 100 according to one embodiment of the present disclosure may exhibit the same effect as a double gate structure.

The interlayer insulating film 160 may be disposed on the gate electrode 150 and the gate insulating film 140.

The interlayer insulating film 160 may include a silicon oxide film SiOx or a silicon nitride film SiNx, and may protect the thin film transistor. In order to contact the active layer 130 and the first and second electrodes 171 and 172, a portion of the interlayer insulating film 160 corresponding to the contact hole CH1 and CH2 may be removed.

The first electrode 171 and the second electrode 172 may be disposed on the interlayer insulating film 160.

The first electrode 171 may serve as a source electrode, and the second electrode 172 may serve as a drain electrode. However, the embodiments of the present disclosure are not limited thereto, and the first electrode 171 may serve as a drain electrode, and the second electrode 172 may serve as a source electrode. In addition, the first connection portion 130*a* and the second connection portion 130*b* serve as a source electrode and a drain electrode, respectively, and the first electrode 171 and the second electrode 172 may serve as a connection electrode between the devices.

The first electrode 171 and the second electrode 172 may be connected to the active layer 130 through the first contact hole CH1 and the second contact hole CH2, respectively. Specifically, the first electrode 171 may be in contact with the first connection portion 130*a* through the first contact hole CH1. The second electrode 172 may be spaced apart from the first electrode 171 and may be in contact with the second connection portion 130*b* through the second contact hole CH2.

Figure 3:
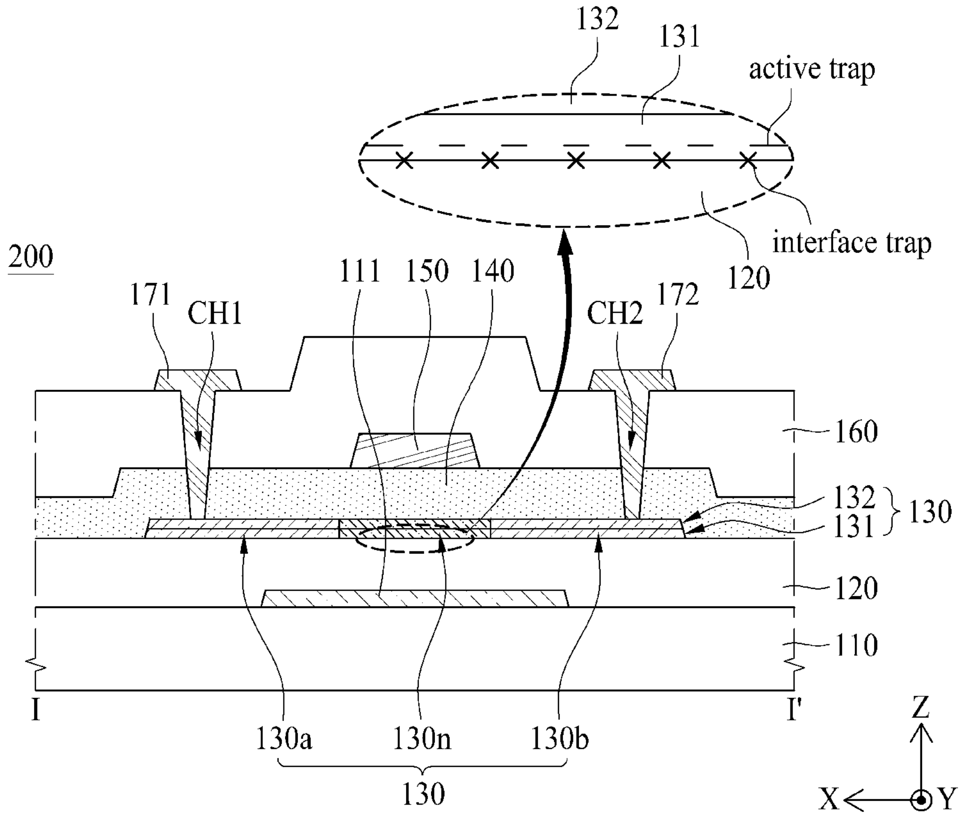
FIG. 3 is a cross sectional view of another embodiment along I-I' of FIG. 1.

FIG. 3 is a cross sectional view of a thin film transistor 200 according to another embodiment of the present disclosure.

Referring to FIG. 3, an active layer 130 may include a first active layer 131 and a second active layer 132 on the first active layer 131.

According to the embodiment of the present disclosure, the first active layer 131 may include copper.

The first active layer 131 may have excellent film stability and mechanical stability. For example, the first active layer 131 may include at least one of IGZO(InGaZnO)-based active material, IGO(InGaO)-based active material, IGZTO (InGaZnSnO)-based active material, GZTO(GaZnSnO)-based active material, GZO(GaZnO)-based active material, and Go(GaO)-based active material. However, the embodiment of the present disclosure is not limited thereto, and the first active layer 131 may be formed by other oxide semiconductor materials generally known to those in the art.

For example, the second active layer 132 may be formed of IZO(InZnO)-based oxide semiconductor material, TO(SnO)-based oxide semiconductor material, IO(InO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO(GaZnSnO)-based oxide semiconductor material, ITZO(InSnZnO)-based oxide semiconductor material, and FIZO(FeInZnO)-based oxide semiconductor material. However, one embodiment of the present disclosure is not limited thereto, and the second active layer 132 may be formed by other oxide semiconductor materials known to those in the art.

Figure 4:
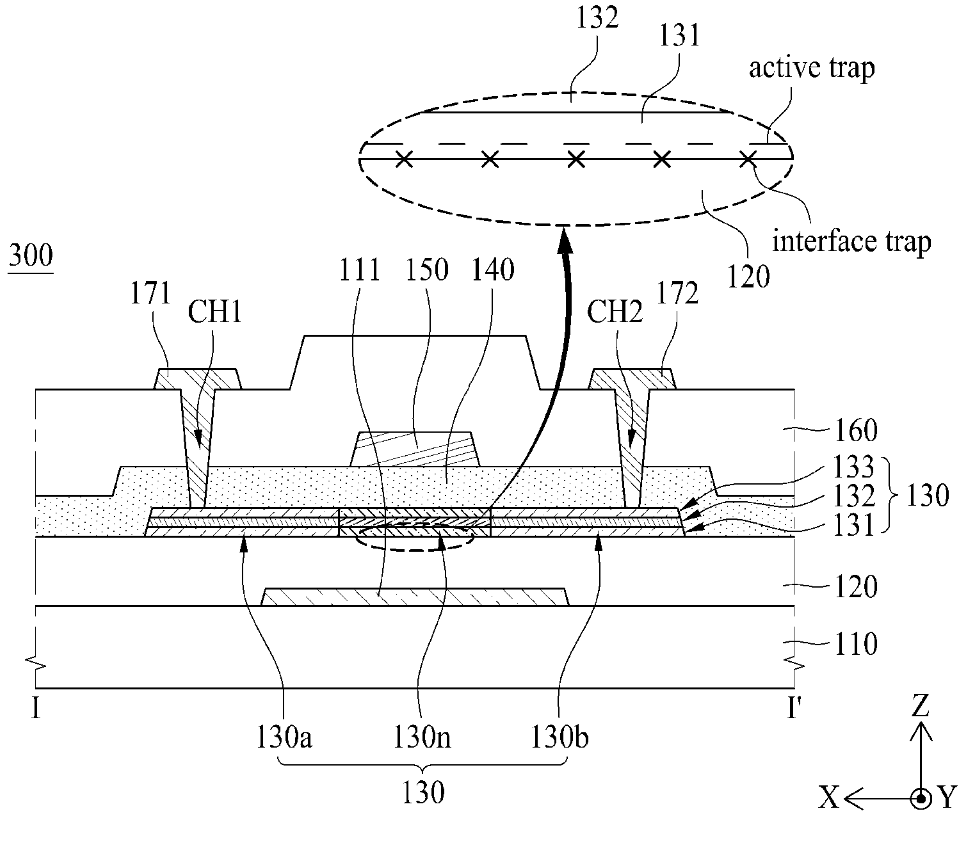
FIG. 4 is a cross sectional view of another embodiment along I-I' of FIG. 1.

FIG. 4 is a cross sectional view of a thin film transistor 300 according to another embodiment of the present disclosure.

Referring to FIG. 4, an active layer 130 may include a first active layer 131, a second active layer 132 on the first active layer 131, and a third active layer 133 on the second active layer 132.

The third active layer 133 may have excellent film stability and mechanical stability. For example, the third active layer 133 may include at least one of IGZO(InGaZnO)-based active material, IGO(InGaO)-based active material, IGZTO(InGaZnSnO)-based active material, GZTO (GaZnSnO)-based active material, GZO(GaZnO)-based active material, and Go(GaO)-based active material. However, one embodiment of the present disclosure is not limited thereto, and the third active layer 133 may be formed of other oxide semiconductor materials generally known to those in the art.

According to the embodiment of the present disclosure, the third active layer 133 may be the same material as the first active layer 131, but is not limited thereto. The third active layer 133 may be formed of a material different from the first active layer 131.

According to the embodiment of the present disclosure, the first active layer 131 may include copper.

According to the embodiment of the present disclosure, copper Cu may be in an ion state. For example, in the active layer 130, copper Cu may be in a state of Cu2O or CuO. When copper Cu is in a state of Cu2O, copper Cu may be referred to as a monovalent ion Cu+ state. When copper Cu is in a state of CuO, copper Cu may be referred to as a divalent ion $Cu^{2+}$ state.

According to one embodiment of the present disclosure, "copper Cu" means that it includes both copper atoms and copper ions $Cu^{+}$ and $Cu^{2+}$.

According to one embodiment of the present disclosure, copper Cu contained in the first active layer 131 may be mainly in a divalent ion $Cu^{2+}$ state. Specifically, copper Cu of the first active layer 131 includes $Cu^{+}$ and $Cu^{2+}$. According to one embodiment of the present disclosure, the concentration of $Cu^{2+}$ in the first active layer 131 may be higher than the concentration of $Cu^{+}$ in the first active layer 131.

Referring to a fabrication method described below, after forming a copper material layer on the first active layer 131, the copper material layer is removed so that the copper ion $Cu^{+}$ or $Cu^{2+}$ remains in the first active layer 131. After that, a heat treatment is applied thereto, whereby the copper ions may be mainly in the divalent ion $Cu^{2+}$ state. According to one embodiment of the present disclosure, copper Cu of the divalent ion $Cu^{2+}$ state is combined with oxygen, whereby it may be in copper oxide of CuO state.

The copper Cu combined with oxygen may exhibit an effect such as formation of an artificial defect in the first active layer 131. The copper Cu inducing this defect forms an acceptor like trap so that it is possible to increase S-factor of the thin film transistor 100, and to reduce a positive bias temperature stress PBTS. Referring to FIG. 4, since the copper included in the first active layer 131 may be recognized as a kind of defect in the first active layer 131, it may be shown as an active trap, and it may be positioned in the first active layer 131, as shown in FIG. 4.

According to one embodiment of the present disclosure, the interface between the first active layer 131 and the buffer layer 120 may include copper. Herein, "copper Cu" may be in the same form as the copper Cu of the first active layer 131. Therefore, according as the copper Cu in the interface or boundary line between the first active layer 131 and the buffer layer 120 may be in the copper oxide of CuO state in the same manner as the copper of the first active layer 131, the acceptor like trap may be formed so that it is possible to increase the S-factor of the thin film transistor 200, and to reduce the PBTS.

Referring to FIG. 4, the copper included in the interface between the first active layer 131 and the buffer layer 120 may be shown as an interface trap in FIG. 4, and may be positioned in the first active layer 131 and the buffer layer 120, as shown in FIG. 4.

A gate insulating film 140 is disposed on the active layer 130 and the buffer layer 120, is disposed between a gate electrode 150 and the active layer 130 and is configured to protect the active layer 130. The gate insulating film 140 may include a silicon nitride film SiNx or a silicon oxide film SiOx, but not limited thereto. The gate insulating film 140 may have a single-layered structure or a multi-layered structure.

The gate electrode 150 is disposed on the gate insulating film 140. The gate electrode 150 overlaps a channel portion 130*n* of the active layer 130.

The gate electrode 150 may include at least one of aluminum-based metal materials such as aluminum Al or aluminum alloys, silver-based metal materials such as silver Ag or silver alloys, copper-based metal materials such as copper Cu or copper alloys, molybdenum-based metal materials such as molybdenum Mo or molybdenum alloys, chromium Cr, tantalum Ta, neodymium Nd, and titanium Ti. The gate electrode 150 may have a multi-layered structure including at least two conductive layers having the different physical properties.

An interlayer insulating film 160 may be disposed on the gate electrode 150 and the gate insulating film 140.

The interlayer insulating film 160 may include a silicon oxide film SiOx or a silicon nitride film SiNx, and may protect the thin film transistor. In order to contact the active layer 130 and first and second electrodes 171 and 172, a portion of the interlayer insulating film 160 corresponding to the contact hole CH1 and CH2 may be removed.

The first electrode 171 and the second electrode 172 may be disposed on the interlayer insulating film 160.

The first electrode 171 may serve as a source electrode, and the second electrode 172 may serve as a drain electrode. However, the embodiments of the present disclosure are not limited thereto, and the first electrode 171 may serve as a drain electrode, and the second electrode 172 may serve as a source electrode. In addition, a first connection portion 130*a* and a second connection portion 130*b* serve as a source electrode and a drain electrode, respectively, and the first electrode 171 and the second electrode 172 may serve as a connection electrode between the devices.

The first electrode 171 and the second electrode 172 may be connected to the active layer 130 through the first contact hole CH1 and the second contact hole CH2, respectively. Specifically, the first electrode 171 may be in contact with the first connection portion 130*a* through the first contact hole CH1. The second electrode 172 may be spaced apart from the first electrode 171 and may be in contact with the second connection portion 130*b* through the second contact hole CH2.

FIGS. 5A to 5F show a fabrication method of the thin film transistor according to the embodiment of the present disclosure.

Figure 5A:
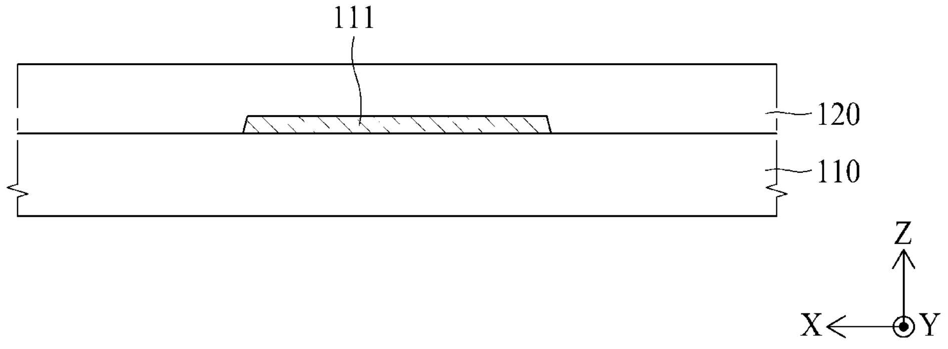
FIGS. 5A to 5F show a fabrication method of a thin film transistor according to the embodiment of the present disclosure.

Referring to FIG. 5A, the light shielding layer 111 is formed on the substrate 110. Then, the buffer layer 120 is formed on the light shielding layer 111 and the substrate 110.

Figure 5B:
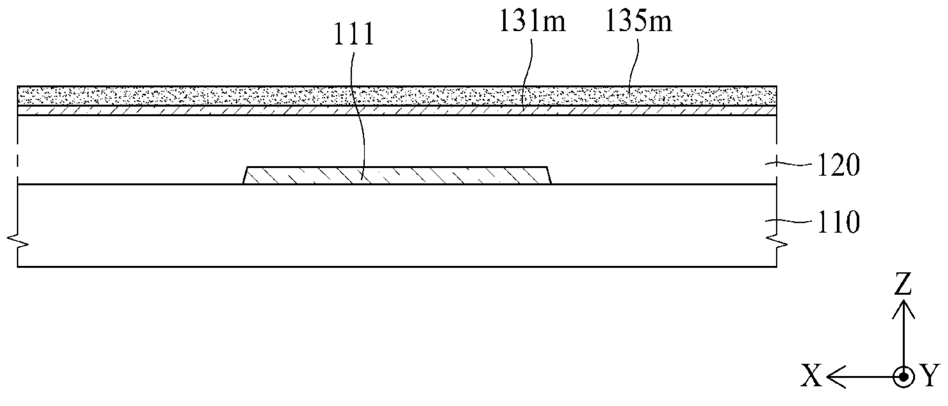

Referring to FIG. 5B, a first active material layer 131*m* is formed on the buffer layer 120, and then a copper material layer 135*m* is formed on the first active material layer 131*m*.

The first active material layer 131*m* may include an oxide semiconductor material. The first active material layer 131*m* may be formed of the oxide semiconductor material. The first active material layer 131*m* may be provided in a single-layered structure, and the first active material layer 131*m* may include the same material as that of the active layer 130 described in FIG. 1.

The copper material layer 135*m* may include copper Cu. For example, the copper material layer 135*m* may be prepared by a sputtering process, however, a method of preparing the copper material layer 135*m* is not limited to this sputtering process.

Figure 5C:
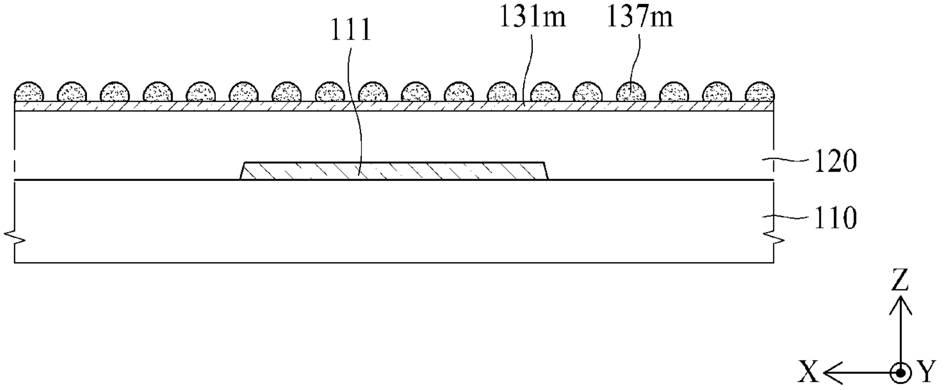

Referring to FIG. 5C, the copper material layer 135*m* may be removed by a wet etch process. In this case, an etchant for the wet etch process of the copper material layer 135*m* may have a high selectivity to the copper material layer 135*m*. Accordingly, the first active material layer 131*m* may be hardly etched by the wet etch process for the copper material layer 135*m*.

For example, the copper material layer 135*m* may have a thickness of 2 nm 5 nm.

Also, as shown in FIG. 5C, the copper material layer 135*m* is removed by the wet etch process, but there may be the remaining copper material 137. The remaining copper material 137*m* is shown as a hemispherical shape having a predetermined thickness in FIG. 5C. However, the remaining copper material 137*m* may remain with only a small thickness at a level which is difficult to measure by a thickness measuring device. For example, the remaining copper material 137*m* of copper ion may remain on the first active material layer 131*m* by the wet etch process. Thus, the remaining copper material 137*m* may be copper ions, and may remain in the state being combined with the surface of the first active material layer 131*m* after the wet etch process.

Figure 5D:
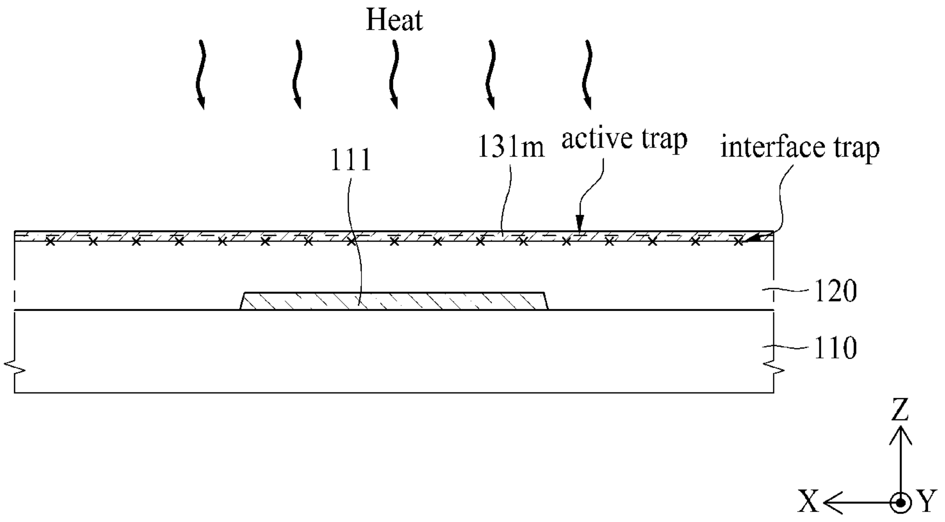

Referring to FIG. 5D, the heat treatment is applied to the remaining copper material 137*m* and the first active material layer 131*m*. The remaining copper material 137*m* may be diffused into the first active material layer 131*m*. As described above, the remaining copper material 137*m* may be the copper ions and may include the monovalent ion $Cu^{+}$ or the divalent ion $Cu^{2+}$. If the heat treatment is applied to the copper, the copper ions may mainly exist in the divalent ion $Cu^{2+}$ state. According to one embodiment of the present disclosure, copper Cu of the divalent ion $Cu^{2+}$ state is combined with oxygen, whereby it may be in copper oxide of CuO state.

The copper Cu combined with oxygen may exhibit an effect such as formation of an artificial defect in the first active material layer 131*m*. The copper Cu inducing this defect forms an acceptor like trap so that it is possible to increase S-factor of the thin film transistor, and to reduce a positive bias temperature stress PBTS.

Also, the interface trap shown in FIG. 5D exemplarily shows the defect formed by the copper oxide CuO between the first active layer 131 and the buffer layer 120. If the artificial defect is generated by the copper oxide CuO between the first active material layer 131*m* and the buffer layer 120, the acceptor like trap may be formed so that it is possible to increase the S-factor of the thin film transistor and to reduce the PBTS.

Figure 5E:
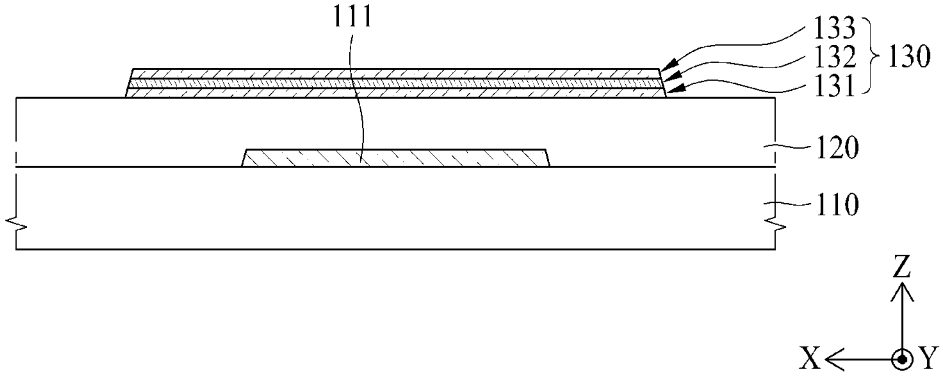

Referring to FIG. 5E, second and third active material layers 132*m* and 133*m* are sequentially formed on the first active material layer 131*m*, and then the active layer 130 is patterned.

Figure 5F:
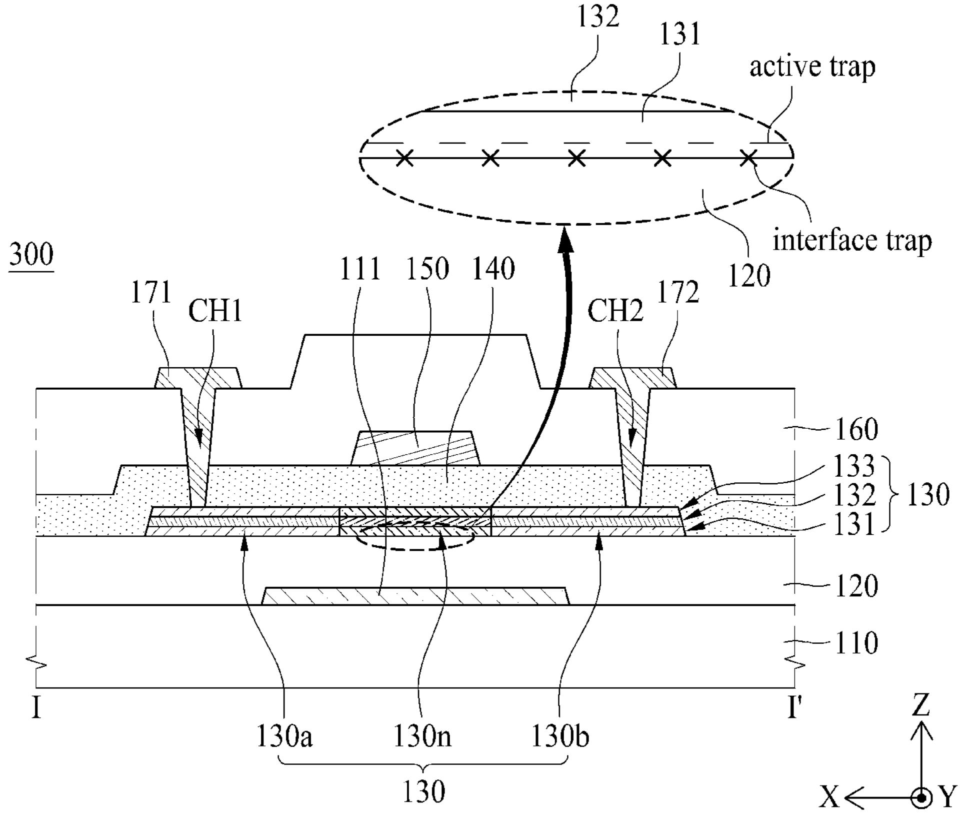

Referring to FIG. 5F, the gate insulating film 140 is formed on the active layer 130. Next, the gate electrode 150 is disposed on the gate insulating film 140. The gate electrode 150 overlaps the channel portion 130*n* of the active layer 130. The interlayer insulating film 160 is disposed on the gate electrode 150 and the gate insulating film 140. The first electrode 171 and the second electrode 172 are disposed on the interlayer insulating film 160, and the first electrode 171 and the second electrode 172 are respectively connected to the active layer 130 through the first contact hole CH1 and the second contact hole CH2. As a result, the thin film transistor 100 according to the embodiment of the present disclosure is completed.

Figure 6:
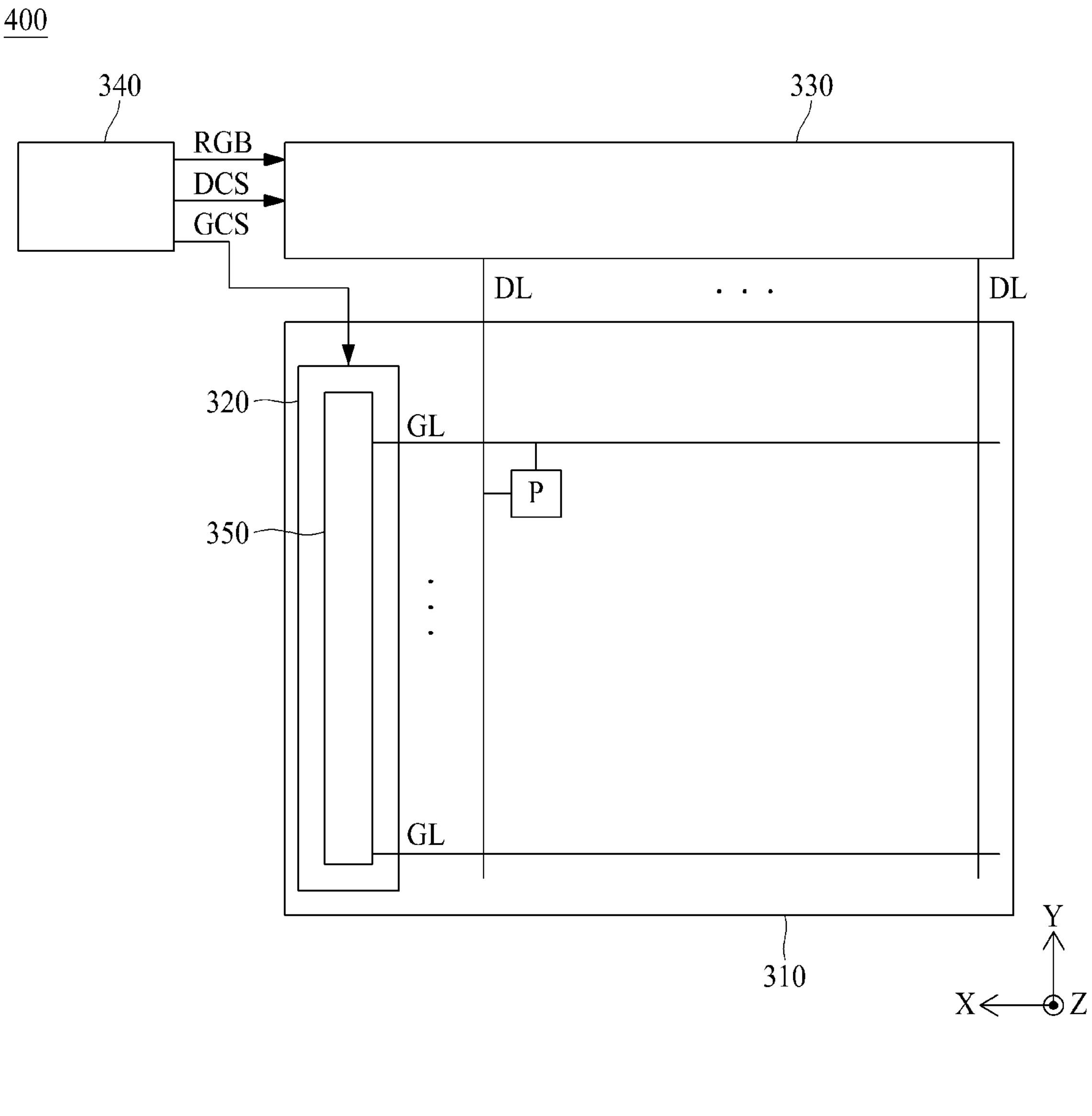
FIG. 6 is a schematic view illustrating a display apparatus according to another embodiment of the present disclosure.

FIG. 6 is a schematic view illustrating a display apparatus 400 according to another embodiment of the present disclosure.

As shown in FIG. 6, the display apparatus 400 according to another embodiment of the present disclosure a display panel 310, a gate driver 320, a data driver 330, and a controller 340.

Gate lines GL and data lines DL are disposed on the display panel 310, and pixels P are disposed in respective crossing areas of the gate lines GL and the data lines DL. An image is displayed by driving the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input video data input from the external system and rearranges the sampled input video data, and supplies the rearranged digital video data RGB to the data driver 330.

The gate control signal GCS includes a gate start pulse GSP, a gate shift clock GSC, a gate output enable signal GOE, a start signal Vst, and a gate clock GCLK. Further, control signals for controlling a shift register may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. Specifically, the data driver 330 converts the video data RGB inputted from the controller 340 into an analog data voltage and supplies the data voltage to the data lines DL.

The gate driver 320 may include the shift register 350.

The shift register 350 sequentially supplies gate pulses to the gate lines GL during one frame by the use of start signal and gate clock transmitted from the controller 340. Herein, the one frame refers to a period in which one image is outputted through the display panel 310. The gate pulse has a turn-on voltage capable of turning on a switching device (thin film transistor) disposed in the pixel P.

Also, during the remaining period of one frame, in which the gate pulse is not supplied, the shift register 350 supplies a gate-off signal capable of turning off the switching device to the gate line GL. Hereinafter, the gate pulse and the gate-off signal are collectively referred to as a scan signal SS or Scan.

According to the embodiment of the present disclosure, the gate driver 320 may be mounted on a base substrate 110. As described above, a structure in which the gate driver 320 is directly mounted on the base substrate 110 is referred to as a gate-in-panel GIP structure.

Figure 7:
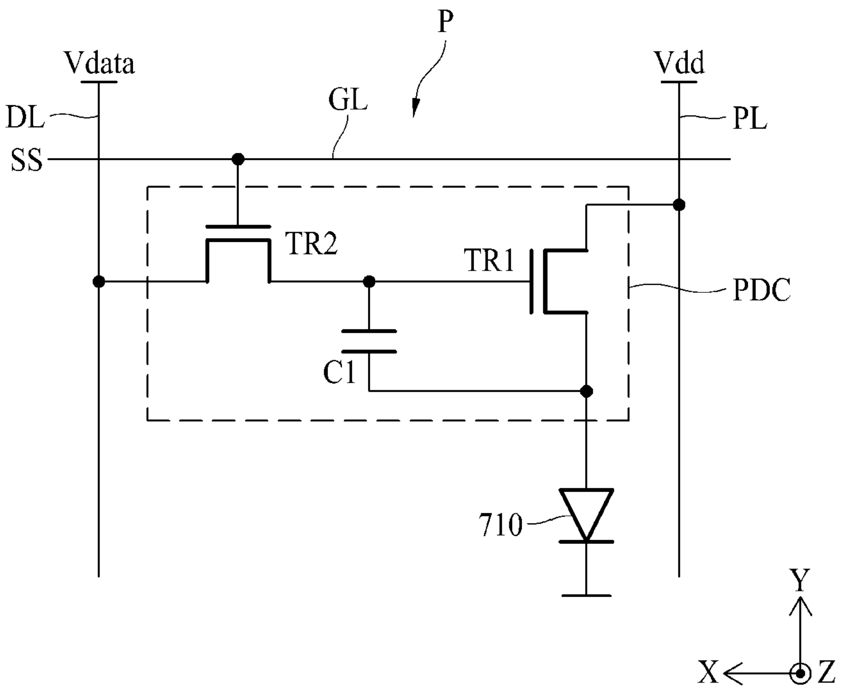
FIG. 7 is a circuit diagram of any one pixel of FIG. 6.
Figure 8:
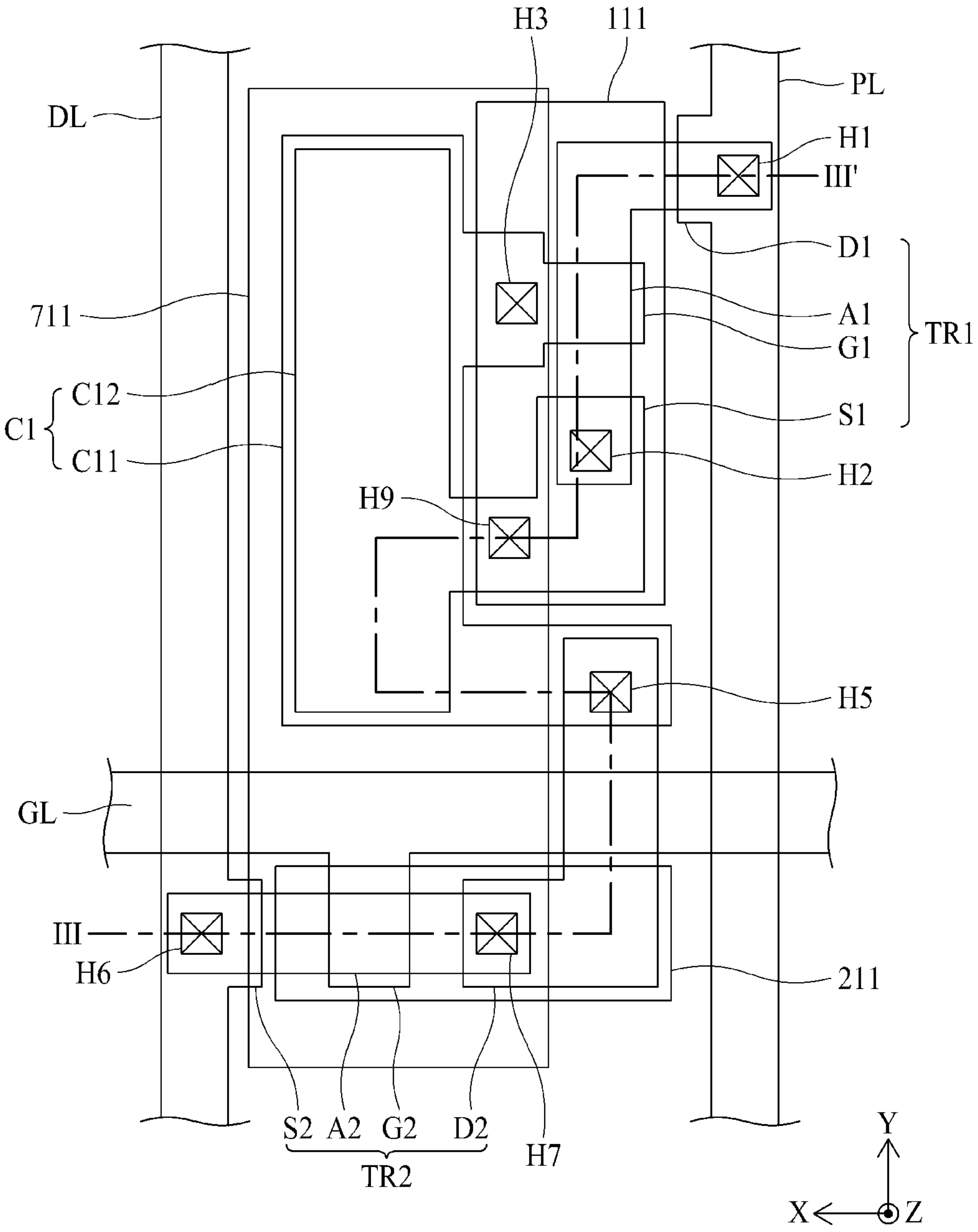
FIG. 8 is a plan view of a pixel shown in FIG. 7.
Figure 9:
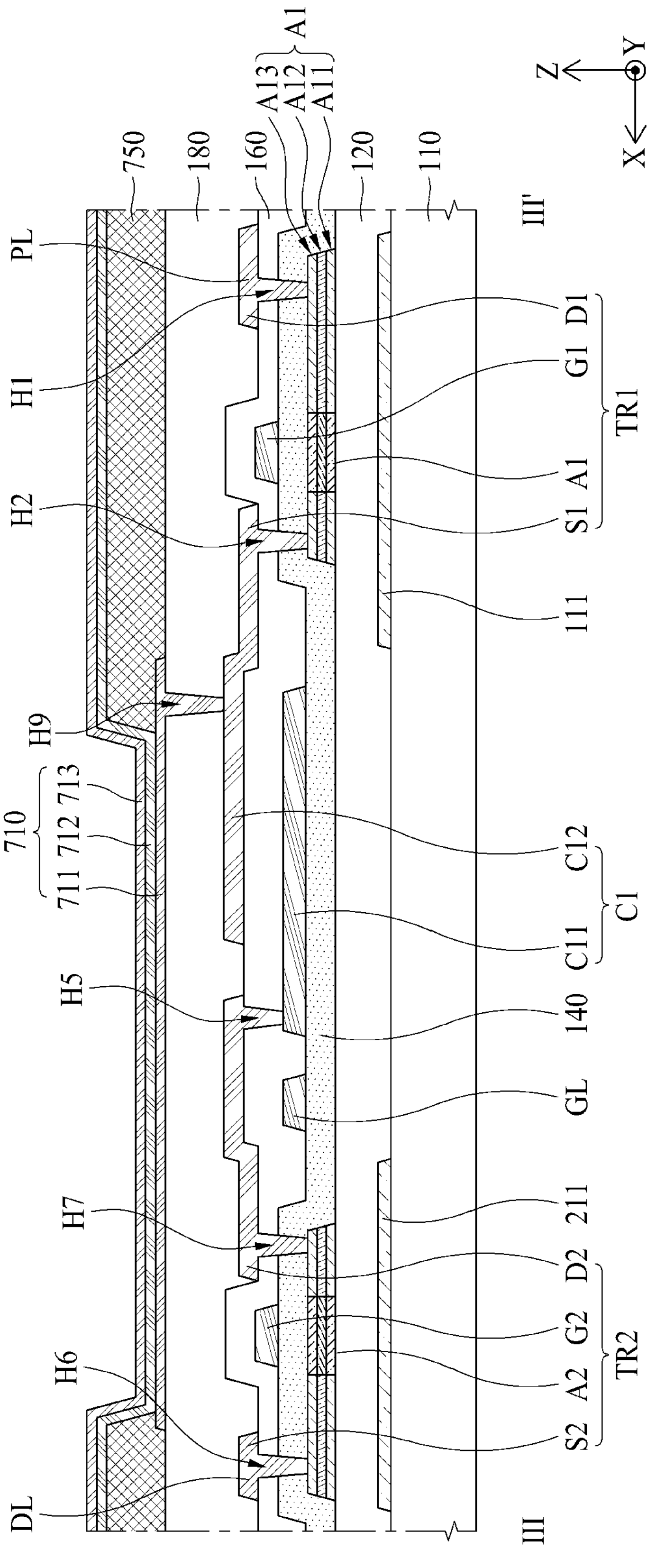
FIG. 9 is a cross sectional view along of FIG. 8.

FIG. 7 is a circuit diagram of any one pixel P of FIG. 6, FIG. 8 is a plan view of the pixel P of FIG. 7, and FIG. 9 is a cross sectional view along of FIG. 8.

The circuit diagram of FIG. 7 is an equivalent circuit diagram of a pixel P of a display apparatus including an organic light emitting diode OLED. The pixel P includes a display device 710, and a pixel driver PDC for driving the display device 710.

According to another embodiment of the present disclosure, the display apparatus includes the pixel driver PDC and the display device 710. The pixel driver PDC includes a first thin film transistor TR1 and a second thin film transistor TR2. The first thin film transistor TR1 and The second thin film transistor TR2 may include the thin film transistors 100, 200, and 300 described above.

According to another embodiment of the present disclosure, the first thin film transistor TR1 is a driving transistor, and the second thin film transistor TR2 is a switching transistor.

The second thin film transistor TR2 is connected to a gate line GL and a data line DL, and is turned on or off by a scan signal SS supplied through the gate line GL.

The data line DL provides a data voltage Vdata to the pixel driver PDC, and the second thin film transistor TR2 controls the application of the data voltage Vdata.

A driving power line PL provides a driving voltage Vdd to the display device 710, and the first thin film transistor TR1 controls the driving voltage Vdd. The driving voltage Vdd is a pixel driving voltage for driving an organic light emitting diode OLED corresponding to the display device 710.

When the second thin film transistor TR2 is turned on by the scan signal SS applied through the gate line GL from a gate driver, the data voltage Vdata supplied through the data line DL is supplied to a gate electrode of the first thin film transistor TR1 connected to the display device 710. The data voltage Vdata is charged to a storage capacitor C1 formed between the gate electrode of the first thin film transistor TR1 and a source electrode of the first thin film transistor TR1.

An amount of current supplied to the organic light emitting diode OLED corresponding to the display device 710 through the first thin film transistor TR1 is controlled by the data voltage Vdata, whereby a grayscale of light emitted from the display device 710 may be controlled.

Referring to FIGS. 8 and 9, the first thin film transistor TR1 and the second thin film transistor TR2 are disposed on the substrate 110.

The substrate 110 may be a glass substrate, a curable or bendable thin film glass substrate, a plastic substrate, or a silicon wafer substrate. If using plastic for the substrate 110, transparent plastic having flexibility, for example, polyimide may be used. If the substrate 110 is formed of polyimide, heat resistant polyimide capable of enduring a high temperature may be used in consideration of a high temperature deposition process on the substrate 110.

The light shielding layers 111 and 211 may be disposed on the substrate 110.

The light shielding layers 111 and 211 block the external light being incident from the outside, to thereby protect active layers A1 and A2 and the first and second thin film transistors TR1 and TR2. The light shielding layers 111 and 211 may be made of a material having the light blocking characteristics or light reflection characteristics. The light shielding layers 111 and 211 may include a lower light shielding layer and an upper light shielding layer. The light shielding layers 111 and 211 may not be disposed on the entire surface of the substrate 110, but may be disposed on at least a portion overlapping the thin film transistor 100.

A buffer layer 120 is disposed on the light shielding layer 111 and the substrate 110.

The buffer layer 120 may be formed in a multi-layered structure by depositing at least one of a silicon oxide film SiOx, silicon nitride film SiN, and a silicon oxynitride film SiON. Other components of the thin film transistor 200 including the light shielding layer 111, which will be described later, may be disposed on the buffer layer 120.

The active layer A1 of the first thin film transistor TR1 and the active layer A2 of the second thin film transistor TR2 are disposed on the buffer layer 120.

The active layer A1 of the first thin film transistor TR1 may include a first active layer A11, a second active layer A12, and a third active layer A13 deposited in sequence, and the active layer A2 of the second thin film transistor TR2 may include a first active layer A21, a second active layer A22, and a third active layer A23 deposited in sequence.

According to the embodiment of the present disclosure, the first active layer A11 of the first thin film transistor TR1 and the first active layer A21 of the second thin film transistor TR2 may include copper.

According to one embodiment of the present disclosure, copper Cu may be in an ion state. For example, in the active layer 130, copper Cu may be in a state of $Cu^2O$ or CuO. When copper Cu is in a state of $Cu^2O$, copper Cu may be referred to as a monovalent ion $Cu^+$ state. When copper Cu is in a state of CuO. copper Cu may be referred to as a divalent ion $Cu^{2+}$ state.

According to one embodiment of the present disclosure, "copper Cu" means that it includes both copper atoms and copper ions $Cu^+$ and $Cu^{2+}$.

According to one embodiment of the present disclosure, copper Cu contained in the first active layer A11 of the first thin film transistor TR1 and the first active layer A21 of the second thin film transistor TR2 may be mainly in a divalent ion $Cu^{2+}$ state. Specifically, copper Cu of the first active layer A11 and A21 includes $Cu^+$ and $Cu^{2+}$. According to one embodiment of the present disclosure, the concentration of $Cu^{2+}$ in the first active layer A11 and A21 may be higher than the concentration of $Cu^+$ in the first active layer A11 and A21.

Referring to a fabrication method, after forming a copper material layer on the first active layer A11 of the first thin film transistor TR1 and the first active layer A21 of the second thin film transistor TR2, the copper material layer is removed so that the copper ion $Cu^+$ or $Cu^{2+}$ remains in the first active layer A11 of the first thin film transistor TR1 and the first active layer A21 of the second thin film transistor TR2. After that, a heat treatment is applied thereto, whereby the copper ions may be mainly in the divalent ion $Cu^{2+}$ state. According to one embodiment of the present disclosure, copper Cu of the divalent ion $Cu^{2+}$ state is combined with oxygen, whereby it may be in copper oxide of CuO state.

The copper Cu combined with oxygen may exhibit an effect such as formation of an artificial defect in the first active layer A11 of the first thin film transistor TR1 and the first active layer A21 of the second thin film transistor TR2. The copper Cu inducing this defect forms an acceptor like trap so that it is possible to increase S-factor of the thin film transistor 100, and to reduce a positive bias temperature stress PBTS.

According to the embodiment of the present disclosure, the interface between the first active layer A11 of the first thin film transistor TR1 and the buffer layer 120 and the interface between the first active layer A21 of the second thin film transistor TR2 and the buffer layer 120 may include copper ion or copper oxide CuO. Herein, "copper Cu" may be in the same form as the copper Cu in the first active layer A11 of the first thin film transistor TR1 and the first active layer A21 of the second thin film transistor TR2. Therefore, as the copper Cu in the interface between the first active layer A11 of the first thin film transistor TR1 and the buffer layer 120 and the interface between the first active layer A21 of the second thin film transistor TR2 and the buffer layer 120 may be in the copper oxide of CuO state in the same manner as the copper in the first active layer A11 of the first thin film transistor TR1 and the first active layer A21 of the second thin film transistor TR2, the acceptor like trap may be formed so that it is possible to increase the S-factor of the thin film transistor 100, and to reduce the PBTS.

A gate insulating film 140 is disposed on the active layer A1 of the first thin film transistor TR1 and the active layer A2 of the second thin film transistor TR2, to thereby protect the active layer A1 of the first thin film transistor TR1 and the active layer A2 of the second thin film transistor TR2. The gate insulating film 140 may include a silicon nitride film SiNx or a silicon oxide film SiOx, but not limited thereto. The gate insulating film 140 may have a single-layered structure or a multi-layered structure.

A first capacitor electrode C11 of a storage capacitor C1 is disposed on the gate insulating film 140. The first capacitor electrode C11 may be connected to the gate electrode G1 of the first thin film transistor TR1. The first capacitor electrode C11 may be integrated into the gate electrode G1 of the first thin film transistor TR1 as one body.

The gate electrode G1 of the first thin film transistor TR1 and a gate electrode G2 of the second thin film transistor TR2 are disposed on the gate insulating film 140. The gate electrode G1 of the first thin film transistor TR1 and the gate electrode G2 of the second thin film transistor TR2 overlap channel portions of the active layers A1 and A2. The gate electrode G1 of the first thin film transistor TR1 and the gate electrode G2 of the second thin film transistor TR2 may be identical in structure to the gate electrode 150 of the thin film transistor 100 shown in FIG. 1.

The gate electrode G1 of the first thin film transistor TR1 and the gate electrode G2 of the second thin film transistor TR2 may include at least one of aluminum-based metal materials such as aluminum A1 or aluminum alloys, silver-based metal materials such as silver Ag or silver alloys, copper-based metal materials such as copper Cu or copper alloys, molybdenum-based metal materials such as molybdenum Mo or molybdenum alloys, chromium Cr, tantalum Ta, neodymium Nd, and titanium Ti. Each of the gate electrode G1 of the first thin film transistor TR1 and the gate electrode G2 of the second thin film transistor TR2 may have a multi-layered structure including at least two conductive layers having the different physical properties.

An interlayer insulating film 160 is disposed on the gate electrode 150 and the gate insulating film 140.

The interlayer insulating film 160 includes a silicon oxide film SiOx or a silicon nitride film SiNx, and may protect the thin film transistor. In order to contact the active layer A1 of the first thin film transistor TR1 and the active layer A2 of the second thin film transistor TR2 to source and drain electrodes, respectively, a portion of the interlayer insulating film 160 corresponding to a contact hole may be removed.

A source electrode S1 and a drain electrode D1 of the first thin film transistor TR1 are disposed on the interlayer insulating film 160, and a source electrode S2 and a drain electrode D2 of the second thin film transistor TR2 are disposed on the interlayer insulating film 160. A data line DL, a driving power line PL, and a second capacitor electrode C12 of the storage capacitor C1 may be disposed on the interlayer insulating film 160.

A portion of the driving power line PL may extend and may be the drain electrode D1 of the first thin film transistor TR1. The drain electrode D1 of the first thin film transistor TR1 is connected to the active layer A1 through a first contact hole H1.

The light shielding layer 111 and the gate electrode G1 under the first thin film transistor TR1 may be connected through a third contact hole H3. As a result, the first thin film transistor TR1 may have the same effect as that of the double gate structure.

The source electrode S1 of the first thin film transistor TR1 is connected to the active layer A1 through a second contact hole H2.

The source electrode S1 of the first thin film transistor TR1 and the second capacitor electrode C12 are connected to each other. The source electrode S1 of the first thin film transistor TR1 and the second capacitor electrode C12 may be integrally formed as one body.

A portion of the data line DL may extend and may be the source electrode S2 of the second thin film transistor TR2. The source electrode S2 of the second thin film transistor TR2 may be connected to the active layer A2 through a sixth contact hole H6.

The drain electrode D2 of the second thin film transistor TR2 may be connected to the active layer A2 through a seventh contact hole H7, and may be connected to the first capacitor electrode C11 through a fifth contact hole H5.

A planarization layer 180 is disposed on the source electrode S1 and the first drain electrode D1 of the first thin film transistor TR1, the source electrode S2 and the second drain electrode D2 of the second thin film transistor TR2, the data line DL, the driving power line PL, and the second capacitor electrode C12.

The planarization layer 180 is formed of an insulating layer and is configured to planarize upper portions of the first thin film transistor TR1 and the second thin film transistor TR2, and to protect the first thin film transistor TR1 and the second thin film transistor TR2.

A first pixel electrode 711 of the display device 710 is disposed on the planarization layer 180. The first pixel electrode 711 contacts the second capacitor electrode C12 through a ninth contact hole H9 formed in the planarization layer 180. As a result, the first pixel electrode 711 may be connected to the source electrode S1 of the first thin film transistor TR1. The ninth contact hole H9 connected to the first pixel electrode 711 formed in the planarization layer 180 may be formed in a non-opening portion of the display device 710 while being overlapped with a bank layer 750.

The bank layer 750 is disposed at an edge of the first pixel electrode 711. The bank layer 750 defines a light emission area of the display device 710.

An organic light emitting layer 712 is disposed on the first pixel electrode 711, and a second pixel electrode 713 is disposed on the organic light emitting layer 712. Accordingly, the display device 710 is configured. The display device 710 shown in FIGS. 8 and 9 is an organic light emitting diode OLED. Accordingly, the display apparatus 400 according to another embodiment of the present disclosure is an organic light emitting display apparatus.

Figure 10:
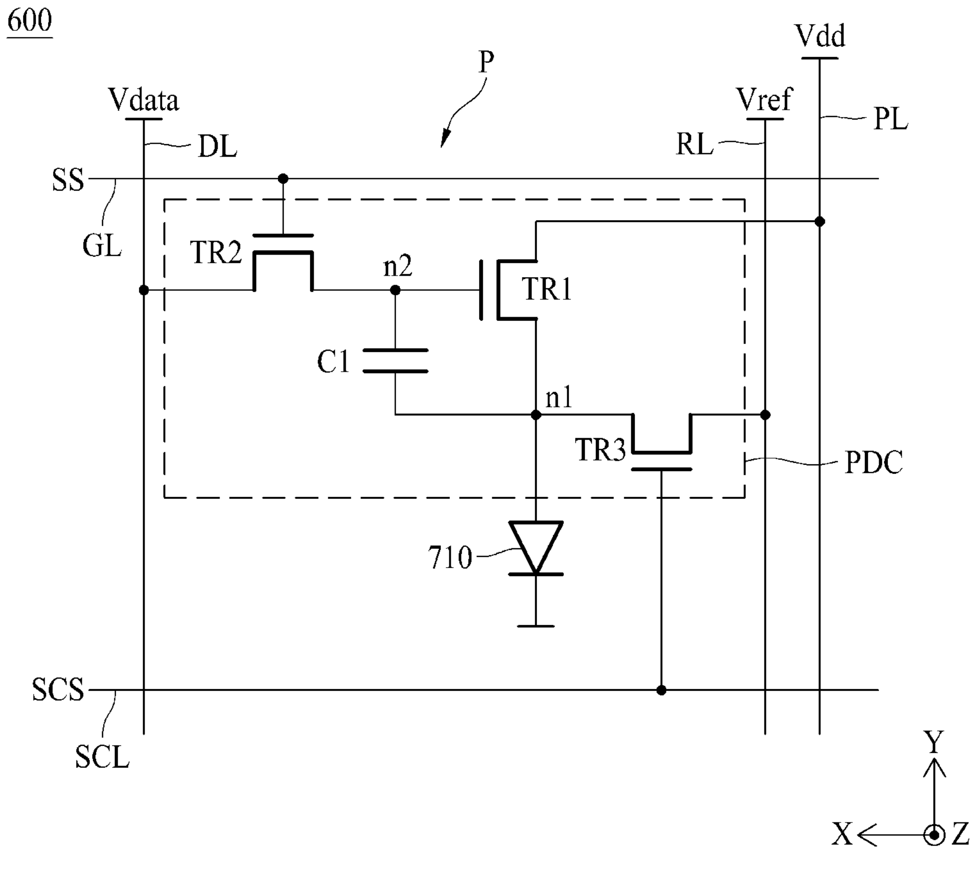
FIG. 10 is a circuit diagram for a pixel of a display apparatus according to another embodiment of the present disclosure.

FIG. 10 is a circuit diagram of any one pixel of a display apparatus according to another embodiment of the present disclosure.

The pixel P of the display apparatus 600 shown in FIG. 10 includes an organic light emitting diode OLED corresponding to a display device 710, and a pixel driver PDC for driving the display device 710. The display device 710 is connected to the pixel driver PDC.

In the pixel P, there are signal lines DL, GL, PL, RL, and SCL to supply a signal to the pixel driver PDC.

A data voltage Vdata is supplied to a data line DL, a scan signal SS is supplied to a gate line GL, a driving voltage Vdd for driving the pixel is supplied to a driving power line PL, a reference voltage Vref is supplied to a reference line RL, and a sensing control signal SCS is supplied to a sensing control line SCL.

For example, the pixel driver PDC includes a second thin film transistor TR2 (switching transistor) connected to the gate line GL and the data line DL, a first thin film transistor TR1 (driving transistor) for controlling a level of current output to the display device 710 according to the data voltage Vdata transmitted through the second thin film transistor TR2, and a third thin film transistor TR3 (reference transistor) for sensing the characteristics of the first thin film transistor TR1.

A storage capacitor C1 is disposed between a gate electrode of the first thin film transistor TR1 and the display device 710.

The second thin film transistor TR2 is turned on by the scan signal SS supplied to the gate line GL, and the turned-on second thin film transistor TR2 transmits the data voltage Vdata supplied to the data line DL to the gate electrode of the first thin film transistor TR1.

The third thin film transistor TR3 is connected to the reference line RL and a first node n1 between the first thin film transistor TR1 and the display device 710, and is turned on or off by the sensing control signal SCS, and senses the characteristics of the first thin film transistor TR1 corresponding to the driving transistor for a sensing period.

A second node n2 connected to the gate electrode of the first thin film transistor TR1 is connected to the second thin film transistor TR2. The storage capacitor Cl is formed between the second node n2 and the first node n1.

When the second thin film transistor TR2 is turned on, the data voltage Vdata supplied through the data line DL is supplied to the gate electrode of the first thin film transistor TR1. The data voltage Vdata is charged to the first capacitor C1 formed between the gate electrode and source electrode of the first thin film transistor TR1.

When the first thin film transistor TR1 is turned on, the current is supplied to the display device 710 through the first thin film transistor TR1 by the driving voltage Vdd for driving the pixel, whereby light is emitted from the display device 710.

Figure 11:
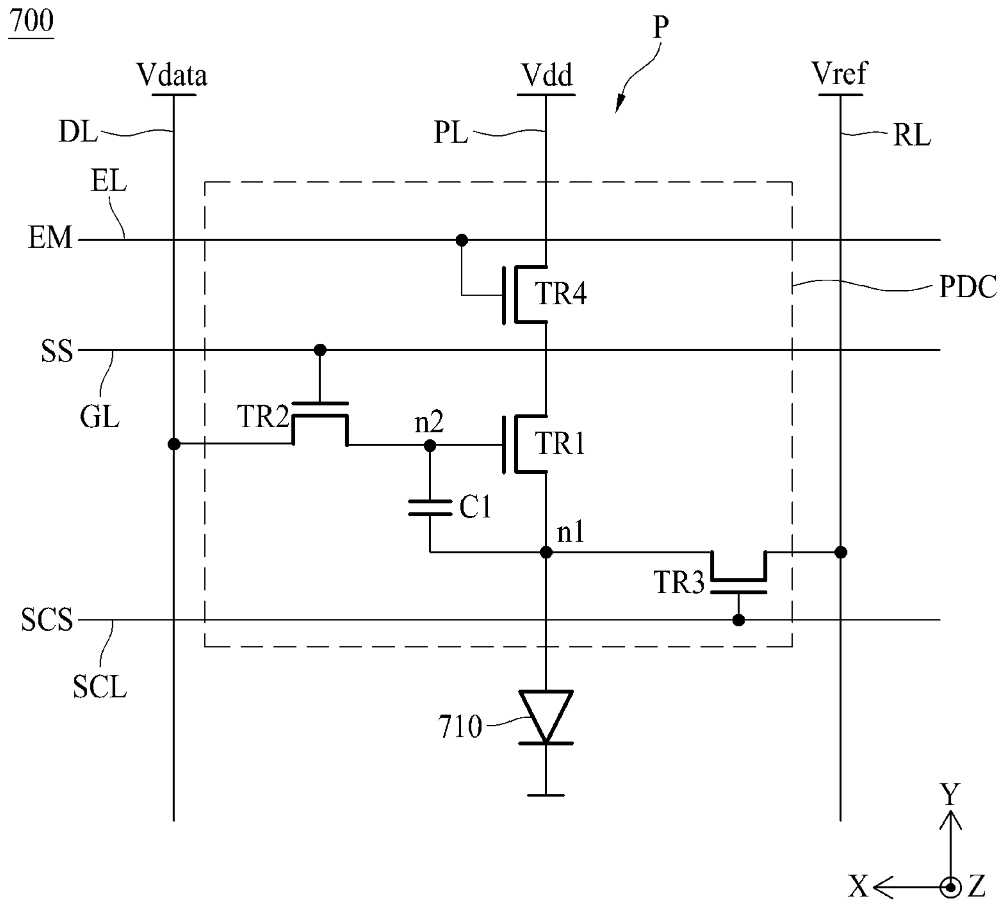
FIG. 11 is a circuit diagram for a pixel of a display apparatus according to still another embodiment of the present disclosure.

FIG. 11 is a circuit diagram of any one pixel of a display apparatus according to still another embodiment of the present disclosure.

The pixel P of the display apparatus 700 shown in FIG. 11 includes an organic light emitting diode OLED corresponding to a display device 710, and a pixel driver PDC for driving the display device 710. The display device 710 is connected to the pixel driver PDC.

The pixel driver PDC includes thin film transistors TR1, TR2, TR3, and TR4.

In the pixel P, there are signal lines DL, EL, GL, PL, SCL, and RL to supply a driving signal to the pixel driver PDC.

In comparison to the pixel P of FIG. 10, the pixel P of FIG. 11 further includes an emission control line EL. An emission control signal EM is supplied to the emission control line EL.

Also, in comparison to the pixel driver PDC of FIG. 10, the pixel driver PDC of FIG. 11 further includes a fourth thin film transistor TR4, which is a light emitting control transistor for controlling an emission time point of the first thin film transistor TR1.

A storage capacitor C1 is disposed between a gate electrode of the first thin film transistor TR1 and the display device 710.

The second thin film transistor TR2 is turned on by a scan signal SS supplied to a gate line GL, and transmits a data voltage Vdata supplied to a data line DL to the gate electrode of the first thin film transistor TR1.

The third thin film transistor TR3 is connected to a reference line RL and is turned on or off by a sensing control signal SCS, and senses the characteristics of the first thin film transistor TR1 corresponding to a driving transistor for a sensing period.

The fourth thin film transistor TR4 transfers a driving voltage Vdd to the first thin film transistor TR1 or blocks the driving voltage Vdd according to the emission control signal EM. When the fourth thin film transistor TR4 is turned on, a current is supplied to the first thin film transistor TR1, whereby light is emitted from the display device 710.

The pixel driver PDC according to another embodiment of the present disclosure may be formed in various structures in addition to the above-described structures. For example, the pixel driver PDC may include five or more thin film transistors.

Accordingly, the thin film transistor according to one embodiment of the present disclosure may improve the PBTS reliability.

The thin film transistor according to one embodiment of the present disclosure has the defect state in the interface between the first active layer and the inorganic insulating layer (first gate insulating film or buffer layer) under the first active layer. The thin film transistor according to one embodiment of the present disclosure, which has the defect state in the interface between the first active layer and the inorganic insulating layer, may improve the PBTS reliability.

According to one embodiment of the present disclosure, the copper Cu ion is provided in the surface of the active layer, and the heat treatment is applied thereto so that it is possible to fabricate the thin film transistor having the first active layer with the defect state. Also, the thin film transistor has the first active layer including the copper Cu ion, whereby it is possible to realize the large S-factor.

The thin film transistor according to one embodiment of the present disclosure is used as the driving transistor of the display apparatus, whereby the display apparatus including this thin film transistor facilitates to the grayscale representation, to thereby realize the great picture quality.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A thin film transistor comprising:
an inorganic insulating layer on a substrate; and
an active layer on the inorganic insulating layer,
wherein the active layer includes:
a channel portion;
a first connection portion which contacts a first side of the channel portion; and
a second connection portion which contacts a second side of the channel portion opposite the first side of the channel portion,
wherein the active layer includes an oxide semiconductor layer, and the active layer includes a carrier acceptor,
wherein the carrier acceptor includes Cu+ and Cu2+, and a concentration of the Cu2+ in the active layer is higher than a concentration of Cu+ in the active layer.

2. The thin film transistor according to claim 1, further comprising:
a light shielding layer under the inorganic insulating layer; and
a gate electrode spaced apart from the active layer and overlapped with at least a portion of the active layer.

3. The thin film transistor according to claim 1,
wherein the active layer includes:
a first active layer; and
a second active layer on the first active layer,
wherein the carrier acceptor is disposed in the first active layer.

4. The thin film transistor according to claim 3, wherein the active layer further includes a third active layer on the second active layer.

5. The thin film transistor according to claim 3, wherein the carrier acceptor is provided in the interface between the first active layer and the inorganic insulating layer.

6. The thin film transistor according to claim 2, wherein the inorganic insulating layer is disposed between the light shielding layer and the active layer.

7. A display apparatus comprising the thin film transistor according to claim 1.

8. A thin film transistor comprising:

an insulating layer on a substrate; and an oxide semiconductor layer on the insulating layer, wherein the oxide semiconductor layer includes:

a channel portion;

a first connection portion which contacts a first side of the channel portion;

a second connection portion which contacts a second side of the channel portion opposite the first side of the channel portion;

wherein the oxide semiconductor layer includes a carrier acceptor including copper material, wherein the copper material includes Cu+ and $Cu^{2+}$, and a concentration of the $Cu^{2+}$in the oxide semiconductor layer is higher than a concentration of $Cu^{+}$in the oxide semiconductor layer.

9. The thin film transistor according to claim 8, wherein the copper material includes copper oxide (CuO).

10. The thin film transistor according to claim 8, wherein the carrier acceptor is formed in a middle of the channel portion of the oxide semiconductor layer.

11. The thin film transistor according to claim 8, wherein the carrier acceptor is formed at an interface between the insulating layer and the channel portion of the oxide semiconductor layer.

12. The thin film transistor according to claim 8, further comprising:

a light shielding layer under the insulating layer and overlapping with at least the channel portion of the oxide semiconductor layer; and a gate electrode spaced apart from the oxide semiconductor layer and overlapped with at least the channel portion of the oxide semiconductor layer, wherein the gate electrode and the light shielding layer are electrically connected to each other.

13. The thin film transistor according to claim 8, wherein the oxide semiconductor layer includes:

a first oxide semiconductor layer including first oxide semiconductor material;

a second oxide semiconductor layer disposed on the first oxide semiconductor layer and including second oxide semiconductor material; and a third oxide semiconductor layer on the second oxide semiconductor and including third oxide semiconductor material, wherein the carrier acceptor layer is disposed in the first oxide semiconductor layer.

* * * * *